US012739999B2

(12) United States Patent
Li et al.

(10) Patent No.: US 12,739,999 B2
(45) Date of Patent: Sep. 15, 2026

(54) CONNECTING ASSEMBLY AND POWER SUPPLY UNIT

(71) Applicant: Delta Electronics (Thailand) Public Company Limited, Samutprakarn (TH)

(72) Inventors: Hongming Li, Samutprakarn (TH); Yong Huang, Samutprakarn (TH)

(73) Assignee: Delta Electronics (Thailand) Public Company Limited, Samutprakarn (TH)

( * ) Notice: Subject to any disclaimer, the term of this patent is extended or adjusted under 35 U.S.C. 154(b) by 237 days.

(21) Appl. No.: 18/784,992

(22) Filed: Jul. 26, 2024

(65) Prior Publication Data

US 2025/0063680 A1 Feb. 20, 2025

(30) Foreign Application Priority Data

Aug. 18, 2023 (CN) ........................ 202322241579.8

(51) Int. Cl.
*H05K 7/14* (2006.01)
*H05K 5/02* (2006.01)

(52) U.S. Cl.
CPC ......... *H05K 7/1432* (2013.01); *H05K 5/0217* (2013.01); *H05K 7/1417* (2013.01); *H05K 7/1485* (2013.01)

(58) Field of Classification Search
CPC .. H05K 7/1432; H05K 7/1417; H05K 7/1482; H05K 5/0217
USPC ........................................................ 361/748
See application file for complete search history.

(56) References Cited

U.S. PATENT DOCUMENTS

2010/0326490 A1* 12/2010 Tagliareni .............. H02S 40/32 361/807
2017/0099416 A1* 4/2017 Pan ....................... F16M 11/04

FOREIGN PATENT DOCUMENTS

CN 104564980 B 2/2018
CN 207185032 U 4/2018

* cited by examiner

*Primary Examiner* — Andargie M Aychillhum
(74) *Attorney, Agent, or Firm* — Qinghong Xu

(57) ABSTRACT

The present disclosure provides a connecting assembly and a power supply unit, which relates to the technical field of battery. The connecting assembly comprises: a first connecting member; a second connecting member; a screw; and a plurality of supporting members, each of which has a first end and a second end. The first end of each supporting member is fixed to the first connecting member, and the second end of each supporting member is provided with an engagement groove and a threaded hole. Each of some supporting members is connected to the second connecting member through the engagement groove, each of the other supporting members is connected to the second connecting member through fit between the threaded hole and the screw. This reduces the number of the screw to be used, saving the cost, and reducing the operation time.

20 Claims, 8 Drawing Sheets

CONNECTING ASSEMBLY AND POWER SUPPLY UNIT

TECHNICAL FIELD

The present disclosure generally relates to the technical field of server power supply, and particularly relates to a connecting assembly and a power supply unit.

BACKGROUND

As the power of the server power supply increases, the size of the power supply unit (PSU) also increases. As the size of printed circuit board (PCB) gradually increases, PCB requires more supporting points for support and fixation to ensure strength and quality.

To solve the problem, the related art adopts the following methods:

1. The PCB of the existing server power supply is fixed with threaded bolts, but each bolt needs to be fixed with a screw, which has a problem of wasting screws and requires a lot of time and effort in the process of locking screws, resulting in low production efficiency.

2. The PCB of the existing server power supply is fixed using an engagement groove structure, but due to the lack of fixation along one direction, it still needs to be fixed with threaded bolts. In this case, it is necessary to reserve two types of materials, which is not conducive to inventory preparation and is prone to confusion.

3. The casing of the existing server power supply is equipped with an engagement groove structure, but this method requires a large area of openings on the PCB, which is not conducive to the layout of other components on the PCB and affects the structural strength of the PCB.

SUMMARY

The present disclosure provides a connecting assembly and a power supply unit, which saves production costs, is conducive to inventory preparation, and has good strength.

According to a first aspect of the present disclosure, a connecting assembly is provided, comprising: a first connecting member; a second connecting member; a screw; and a plurality of supporting members, each of the plurality of supporting members having has a first end and a second end. The first end of each supporting member is fixed to the first connecting member, and the second end of each supporting member is provided with an engagement groove and a threaded hole. Each of some supporting members is connected to the second connecting member through the engagement groove, and each of the other supporting members is connected to the second connecting member through fit between the threaded hole and the screw.

In some embodiments, the second connecting member comprises a protruding portion, and the engagement groove is engaged with the protruding portion by snap fit.

Under the mutual cooperation of the protruding portion and the engagement groove, the second connecting member and the supporting member are fixed by snap fit.

In some embodiments, an axial direction of the threaded hole is perpendicular to an opening direction of the engagement groove.

A connecting direction between the protruding portion and the engagement groove is horizontal, and the connecting direction between the screw and the threaded hole is perpendicular to the connecting direction between the protruding portion and the engagement groove, which constrains the fixation between the first connecting member and the second connecting member in two directions, further improving the stability of the connection between the first connecting member and the second connecting member.

In some embodiments, the threaded hole is arranged in an axial direction of the supporting member.

Wherein, the screw is threaded through the threaded hole to connect the screw thread to the threaded hole, thereby achieving a detachable connection between the screw and the supporting member, facilitating installation and maintenance between the first and second connecting members. Since an extension direction of the threaded hole is the same as the axial direction of the supporting member, a fixation effect of the first and second connecting members in a vertical direction is achieved. Due to a relatively large axial height of the supporting member, the axial height of the supporting member is fully utilized to increase a contact area between the screw and the threaded hole and improve connection reliability between the screw and the threaded hole.

In some embodiments, the engagement groove is a circular groove in a circumferential direction of the supporting member.

If the supporting member rotates relative to the first and second connecting members, when the engagement groove is a circular groove arranged in the circumferential direction of the supporting member, it can ensure that the protruding portion can be engaged with the engagement groove by snap fit at different angles of the supporting member, improving the reliability of the engagement between the protruding portion and the engagement groove.

In some embodiments, the supporting member is used to control distance between the first connecting member and the second connecting member in the axial direction of the supporting member.

The supporting member is arranged between the first connecting member and the second connecting member, and the support member for supporting the first connecting member, providing a certain support force for the first connecting member. If the protruding portion is engaged to the engagement groove by snap fit, the supporting member may control the distance in the axial direction of the supporting member between the first and second connecting members, thereby ensuring the relative positions of the two plane structures of the first and second connecting members. If the screw is threaded through the threaded hole of the supporting member, and the fit between the screw and the supporting member may control the distance between the first and second connecting members in the axial direction of the supporting member, thereby ensuring the relative positions of the two plane structures of the first and second connecting members.

In some embodiments, the second connecting member is a casing.

In some embodiments, the first connecting member is a circuit board or copper bar.

The first connecting member includes but is not limited to electrical components such as a circuit board or a copper bar, and may also be other components inside the power supply unit. If the size of the circuit board is relatively large, a plurality of supporting members may support the first connecting member, increasing the number of supporting points to ensure the support strength of the first connecting member.

In some embodiments, the first end of each of the supporting members is fixed to the first connecting member by welding.

In some embodiments, the first end of each of the supporting members is fixed to the first connecting member by a threaded connection.

The first end of each of the supporting members and the first connecting member may be connected by welding or threaded connection, and of course, they may also be connected through bonding, snap fit, and other methods. The embodiment does not limit the connecting direction between the supporting member and the first connecting member, and may be adjusted according to actual production conditions.

According to a second aspect of the present disclosure, the embodiment of the present disclosure also provides a power supply unit, including the connecting assembly mentioned above.

An embodiment of the present disclosure has the following advantages or beneficial effects:

The connecting assembly of the embodiment of the present disclosure utilizes the screw and a plurality of supporting members to achieve the connection between the first and second connecting members. Some of the supporting members are connected to the second connecting member through the engagement groove, while the others are connected to the second connecting member through the fit between the screw and the threaded hole. These two fixing methods may be used simultaneously, and in the case that the number of the supporting member is the same, the number of the screw used for fixing can be reduced, and the number of the engagement groove used for fixing can be increased, thereby reducing the number of the screw to be used.

In the power supply unit of the embodiment of the present disclosure, the first connecting member and the second connecting member are connected through the screw and a plurality of supporting members. As to the supporting member, as it has two fixing functions at the same time, only one type of the supporting member material inventory needs to be prepared to achieve two fixing methods.

BRIEF DESCRIPTION OF THE DRAWINGS

In order to better understand the present disclosure, reference can be made to the embodiments shown in the accompanying drawings below. The components in the accompanying drawings may not necessarily be proportional, and the relevant components may be omitted to emphasize and clearly illustrate the technical features of the present disclosure. In addition, relevant elements or components may have different settings as known in the field. In addition, in the accompanying drawings, the same reference numerals represent the same or similar components. By referring to the accompanying drawings to describe in detail the exemplary embodiments, the above and other features and advantages of the present disclosure will become more apparent.

Wherein.

LIST OF REFERENCE NUMBERS

Figure 1:
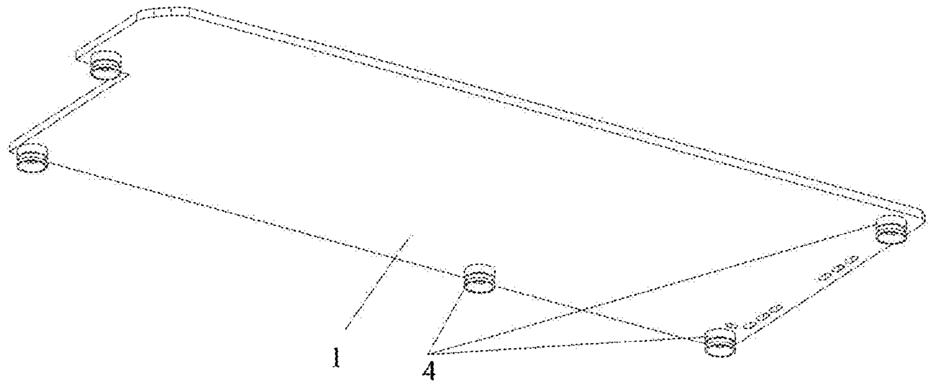
FIG. 1 shows a structural schematic view of the first connecting member of the connecting assembly of an embodiment of the present disclosure.

1 first connecting member;
2 second connecting member; 21 protruding portion; 22 mainboard;
3 screw;
4 supporting member; 41 engagement groove; 42 threaded hole; 43 main body portion; 44 shaft portion

DETAILED DESCRIPTION

The following will provide a clear and complete description of the technical solution in the exemplary embodiment of the present disclosure, in conjunction with the accompanying drawings. The example embodiments described herein are only for illustrative purposes and are not intended to limit the protection scope of the present disclosure. Therefore, it should be understood that various modifications and changes can be made to the example embodiments without departing from the protection scope of the present disclosure.

In the description of the present disclosure, unless otherwise specified and limited, the terms “first” and “second” are only used for the purpose of description and cannot be understood as indicating or implying relative importance; the term “a plurality of” refers to two or more; the term “and/or” includes any combination and all combinations of one or more related listed items. Particularly, the mention of the “the/said” object or “one” object is also intended to represent one of a plurality of such possible objects.

Unless otherwise specified or illustrated, the terms “connect”, “fix”, etc. should be understood in a broad sense. For example, “connect” can be a fixed connection, a detachable connection, an integrated connection, an electrical connection, or a signal connection; “connect” can be directly connected or indirectly connected through intermediate media. For the person skilled in the art, the specific meanings of the above terms in the present disclosure can be understood based on specific circumstances.

Furthermore, in the description of the present disclosure, it should be understood that the directional words “up”, “down”, “inside”, “outside”, etc. described in the exemplary embodiments of the present disclosure are described from the perspective shown in the attached drawings and should not be understood as limiting the exemplary embodiments of the present disclosure. It should also be understood that in the context, when it is mentioned that a component or feature is connected “up”, “down”, or “in”, “out” to another component(s), it can not only be directly connected “up”, “down”, or “in”, “out” to another component(s), but also indirectly connected “up”, “down”, or “in”, “out” to another component(s).

Now refer to the accompany drawings for a more comprehensive description of the exemplary embodiments. However, the exemplary embodiments can be implemented in a plurality of forms and should not be limited to the embodiments described herein. On the contrary, providing these implementation methods makes the present disclosure comprehensive and complete, and comprehensively conveys the concept of the example implementation methods to those skilled in the art. The same reference numerals in the figures represent the same or similar structures, therefore their detailed descriptions will be omitted.

Figure 2:
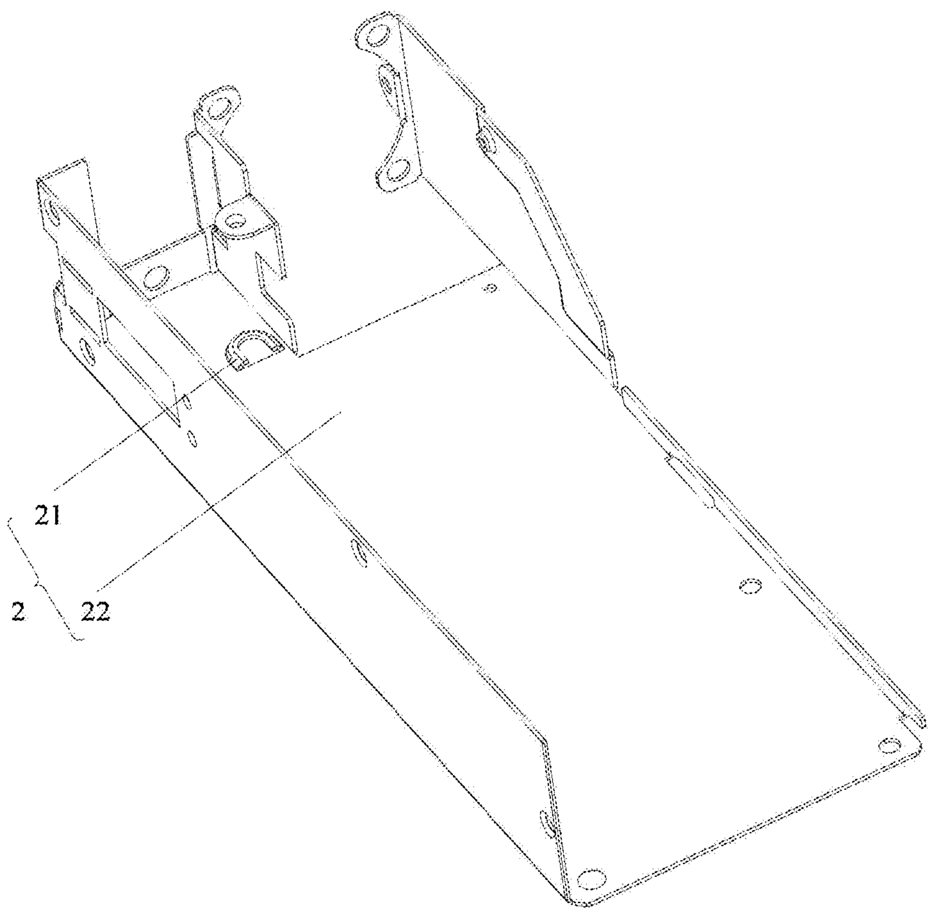
FIG. 2 shows a structural schematic view of the second connecting member of the connecting assembly of an embodiment of the present disclosure.
Figure 3:
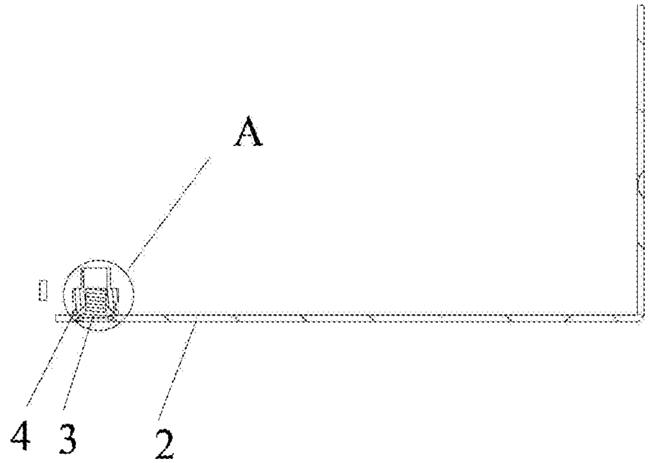
FIG. 3 shows a structural schematic view of the fit between the first connecting member and the supporting member of the connecting assembly of an embodiment of the present disclosure.
Figure 4:
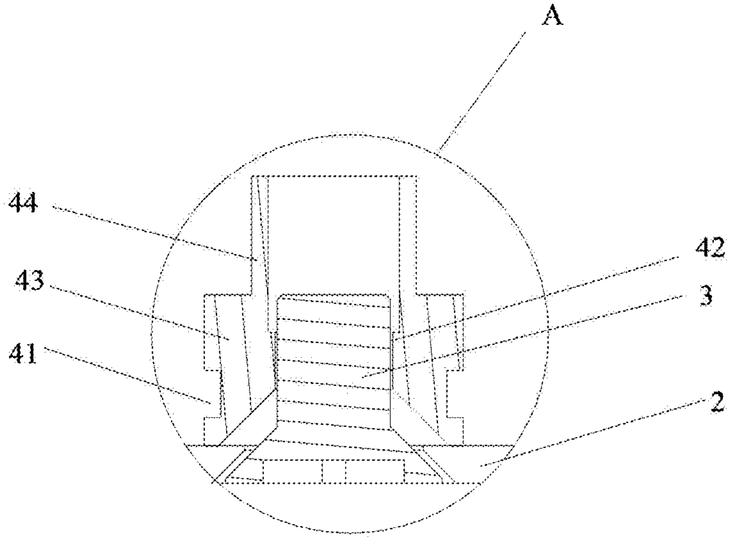
FIG. 4 shows a partially enlarged view of FIG. 3 at position A.

FIG. 1 shows a structural schematic view of the first connecting member of the connecting assembly of an embodiment of the present disclosure, FIG. 2 shows a structural schematic view of the second connecting member of the connecting assembly of an embodiment of the present disclosure, FIG. 3 shows a structural schematic view of the fit between the first connecting member and the supporting member of the connecting assembly of an embodiment of the present disclosure, FIG. 4 shows a partially enlarged view of FIG. 3 at position A.

The embodiment provides a connecting assembly, as shown in FIGS. 1 to 4. The connecting assembly includes a first connecting member 1, a second connecting member 2, a screw 3, and a plurality of supporting members 4. Each supporting member 4 has the same structure and size, and each supporting member 4 has a first end and a second end. The first end of each supporting member 4 is fixed to the first connecting member 1, and the second end of each supporting member 4 is provided with an engagement groove 41 and a threaded hole 42, each of some supporting members 4 is connected to the second connecting member 2 through the engagement groove 41, while each of the other supporting members 4 is connected to the second connecting member 2 through fit between the threaded hole 42 and the screw 3.

The connecting assembly of this embodiment uses the screw 3 and a plurality of supporting members 4 to achieve a connection between the first connecting member 1 and the second connecting member 2. Each of some supporting members 4 is connected to the second connecting member 2 through the engagement groove 41, while each of the other supporting members 4 is connected to the second connecting member 2 through fit between the screw 3 and the threaded hole 42. Both fixing methods may be used simultaneously. Under the condition of the same number of supporting members 4, the number of screws 3 used for fixation can be reduced, and the number of engagement grooves used for fixation can be increased, thereby reducing the number of screws 3 which are used.

In some embodiments, the first connecting member 1 is a circuit board or a copper bar.

It can be understood that the first connecting member 1 of the embodiment includes but is not limited to electrical components such as the circuit board or the copper bar, as well as other components inside the power supply unit. If the size of the circuit board is relatively large, a plurality of supporting members 4 may support the first connecting member 1, increasing the number of supporting points to ensure the support strength of the first connecting member 1.

In some embodiments, the second connecting member 2 is a casing.

It can be understood that the second connecting member 2 of the embodiment includes but is not limited to the casing, and may also be another fixed member or another connecting member to be connected.

In one embodiment, as shown in FIGS. 3 to 4, the threaded hole 42 is arranged along an axial direction of the supporting member 4.

The screw 3 is threaded through the threaded hole 42 to connect the screw 3 to the threaded hole 42, thereby achieving a detachable connection between the screw 3 and the supporting member 4, facilitating installation and maintenance between the first connecting member 1 and the second connecting member 2. Since an extension direction of the threaded hole 42 is the same as the axial direction of the supporting member 4, a fixation of the first connecting member 1 and the second connecting member 2 along a vertical direction is achieved. Due to a relatively large axial height of the supporting member 4, the axial height of the supporting member 4 is fully utilized to increase a contact area between the screw 3 and the threaded hole 42 and improve connection reliability between the screw 3 and the threaded hole 42.

Figure 5:
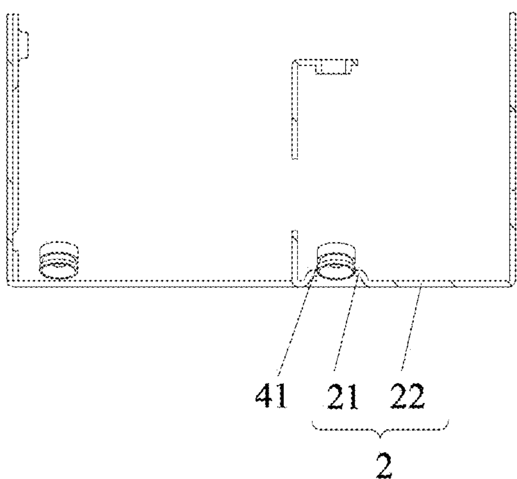
FIG. 5 shows a structural schematic view of the fit between the second connecting member and the supporting member of the connecting assembly of an embodiment of the present disclosure.

FIG. 5 shows a structural schematic view of the fit between the second connecting member and the supporting member of the connecting assembly of an embodiment of the present disclosure.

In one embodiment, as shown in FIGS. 4 to 5, an axial direction of the threaded hole 42 is perpendicular to an opening direction of the engagement groove 41.

Particularly, a connecting direction between the protruding portion 21 and the engagement groove 41 is horizontal, and a connecting direction between the screw 3 and the threaded hole 42 is perpendicular to the connecting direction between the protruding portion 21 and the engagement groove 41, so that fixation between the first connecting member 1 and the second connecting member 2 is constrained in two directions, further improving the stability of the connection between the first connecting member 1 and the second connecting member 2.

In one embodiment, as shown in FIGS. 4 to 5, the second connecting member 2 includes a protruding portion 21, and the engagement groove 41 is engaged with the protruding portion 21.

With the cooperation of the protruding portion 21 and the engagement groove 41, the second connecting member 2 and the supporting member 4 are fixed by snap fit.

In one embodiment, as shown in FIG. 5, the second connecting member 2 further includes a mainboard 22. At least a part of the mainboard 22 is parallel with the first connecting member 1, and the protruding portion 21 is arranged on the mainboard 22. Wherein, the protruding portion 21 and the mainboard 22 are integrated to reduce assembly process of component and save production costs.

Figure 6:
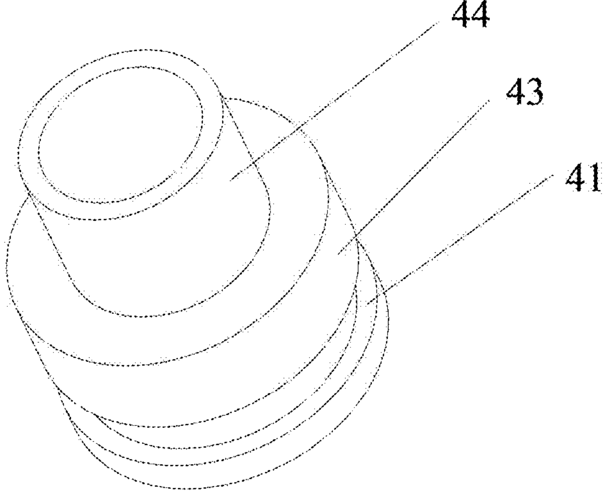
FIG. 6 shows a first structural schematic view of the supporting member of the connecting assembly of an embodiment of the present disclosure.
Figure 7:
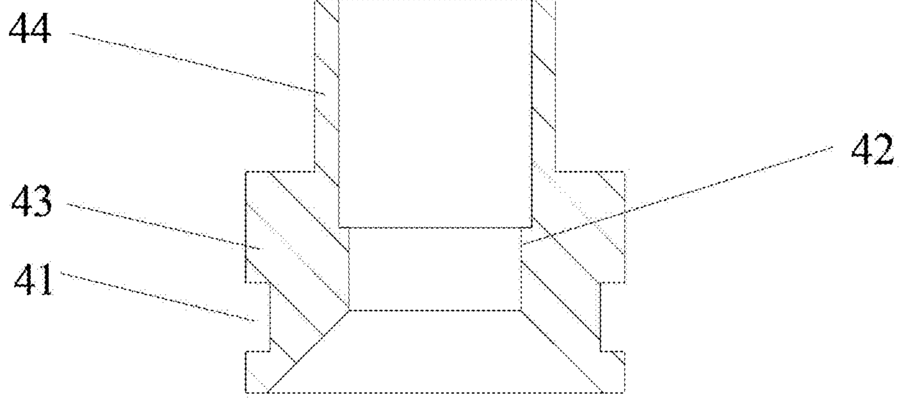
FIG. 7 shows a cross-sectional view of the supporting member of the connecting assembly of an embodiment of the present disclosure.
Figure 8:
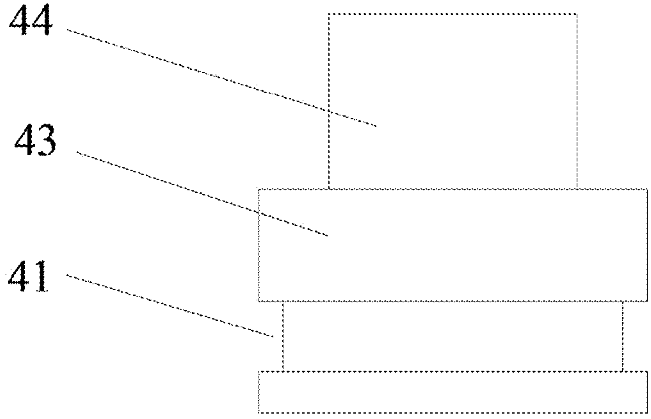
FIG. 8 shows a second structural schematic view of the supporting member of the connecting assembly of an embodiment of the present disclosure.

FIG. 6 shows a first structural schematic view of the supporting member of the connecting assembly of an embodiment of the present disclosure, FIG. 7 shows a cross-sectional view of the supporting member of the connecting assembly of an embodiment of the present disclosure, FIG. 8 shows a second structural schematic view of the supporting member of the connecting assembly of an embodiment of the present disclosure.

In one embodiment, as shown in FIGS. 6 to 8, the engagement groove 41 is a circular groove along a circumferential direction of the supporting member 4.

If the supporting member 4 rotates relative to the first connecting member 1 and the second connecting member 2, when the engagement groove 41 is the circular groove arranged along the circumferential direction of the supporting member 4, it can be ensured that the protruding portion 21 may be engaged with the engagement groove 41 at different angles of the supporting member 4, improving the reliability of the engagement between the protruding portion 21 and the engagement groove 41.

In one embodiment, the supporting member 4 is used to control distance between the first connecting member 1 and the second connecting member 2 along the axial direction of the supporting member 4.

Particularly, the supporting member 4 is arranged between the first connecting member 1 and the second connecting member 2, and the supporting member 4 is used to support the first connecting member 1, providing a certain support force for the first connecting member 1. If the protruding portion 21 is engaged to the engagement groove 41, the supporting member 4 may control the distance between the first connecting member 1 and the second connecting member 2 along the axial direction of the supporting member 4, thereby ensuring a relative position of the first connecting member 1 and the second connecting member 2. If the screw 3 is threaded through the threaded hole 42 of the supporting member 4, and the screw 3 is matched with the supporting member 4, the distance between the first connecting member 1 and the second connecting member 2 along the axial direction of the supporting member 4 may be controlled, thereby ensuring the relative position of the first connecting member 1 and the second connecting member 2.

In one embodiment, as shown in FIGS. 6 to 8, the supporting member 4 includes a main body portion 43 and a shaft portion 44. The main body portion 43 is arranged between the first connecting member 1 and the second connecting member 2, and the shaft portion 44 is arranged at an end of the main body portion 43 towards the first connecting member 1 and extends through the first connecting member 1.

Particularly, the shaft portion 44 of the supporting member 4 is extended through the first connecting member 1, the shaft portion 44 is used for connecting and fixing with the first connecting member 1, and the main body portion 43 of the supporting member 4 is arranged between the first connecting member 1 and the second connecting member 2 for supporting the first connecting member 1. By adjusting a height of the main body portion 43 along the axial direction of the supporting member 4, an aim of controlling the axial distance between the first connecting member 1 and the second connecting member 2 can be achieved.

A diameter of the main body portion 43 is greater than a diameter of the shaft portion 44 to form a step between the main body portion 43 and the shaft portion 44, the step may be used to bear and limit the first connecting member 1.

It should be noted that the engagement groove 41 is arranged on the main body portion 43, and the threaded hole 42 may be only provided on the main body portion 43, and the threaded hole 42 may alternatively be provided both on the main body portion 43 and the shaft portion 44.

In one embodiment, the number of supporting members 4 is multiple, the number of screws 3 is smaller than the number of supporting members 4, and the number of screws 3 is smaller than the number of protruding portions 21.

For example, the number of supporting members 4 is five, and if the existing connection method is used, five screws 3 are needed for fixation. However, in the embodiment, the number of screws 3 is one, and the number of protruding portions 21 is four. Four protruding portions 21 are correspondingly engaged with four engagement grooves 41, and only one screw 3 is threaded through the threaded hole 42 of the supporting member 4, thus reducing the number of screws 3 and saving the use cost and operation process of the screw 3. At the same time, only one type of the supporting member 4 needs to be prepared, making procurement and inventory more concise and reducing the risk of confusion.

In one embodiment, the first end of the supporting member 4 is fixed to the first connecting member 1 by welding. Alternatively, the first end of the supporting member 4 is fixed to the first connecting member 1 by a threaded connection.

It can be understood that the first end of the supporting member 4 and the first connecting member 1 may be connected by welding or a threaded connection, and of course, they may also be connected by bonding, snap fit or other methods. The embodiment does not limit a connection direction between the supporting member 4 and the first connecting member 1, which may be adjusted according to actual production situations.

The embodiment further provides a power supply unit, including the connecting assembly mentioned above.

In the power supply unit of the embodiment, the first connecting member 1 and the second connecting member 2 are connected through the screw 3 and a plurality of supporting members 4. As to the supporting member 4, as it has two fixing functions at the same time, only one type of the supporting member 4 needs to be prepared to achieve two fixing methods.

It should be noted that the connecting assembly shown in the attached drawings and described in the description are only an example of adopting the principles of the present disclosure. The person skilled in the art should clearly understand that the principle of the present disclosure is not limited to any details or components of the device shown in the attached drawings or described in the description.

It should be understood that the present disclosure does not limit its application to the detailed structure and arrangement of the components of the description. The present disclosure may have other embodiments and may be implemented and executed in multiple ways. The aforementioned deformation and modification forms fall within the scope of the present disclosure. It should be understood that the disclosed and limited disclosure of the description extends to all alternative combinations of two or more individual features mentioned or apparent in the text and/or the accompanying drawings. All these different combinations constitute multiple replaceable aspects of the present disclosure. The embodiments described in the description illustrate the best modes for implementing the present disclosure, and will enable those skilled in the art to utilize the present disclosure.

The person skilled in the art will easily come up with other implementation solutions of the present disclosure after considering the invention disclosed in the specification and practice. The present disclosure aims to cover any variations, uses, or adaptive changes of the present disclosure, which follow the general principles of the present disclosure and include common knowledge or customary means in the technical field that are not disclosed in the present disclosure. The specification and exemplary embodiments are only considered exemplary, and the true scope and spirit of the present disclosure are indicated by the accompanying claims.

It should be understood that the present disclosure is not limited to the precise structure already described and shown in the attached drawings, and may be modified and changed in various ways without departing from its scope. The protection scope of the present disclosure is limited only by the accompanying claims.

What is claimed is:

1. A connecting assembly, comprising:

a first connecting member;

a second connecting member;

a screw; and a plurality of supporting members, each of the plurality of supporting members having a first end and a second end, the first end of each supporting member being fixed to the first connecting member, the second end of each supporting member being provided with an engagement groove and a threaded hole, each of some supporting members being connected to the second connecting member through the engagement groove, and each of the other supporting members being connected to the second connecting member through fit between the threaded hole and the screw.

2. The connecting assembly according to claim 1, wherein the second connecting member comprises a protruding portion, and the engagement groove is engaged with the protruding portion.

3. The connecting assembly according to claim 1, wherein an axial direction of the threaded hole is perpendicular to an opening direction of the engagement groove.

4. The connecting assembly according to claim 1, wherein the threaded hole is arranged in an axial direction of the supporting member.

5. The connecting assembly according to claim 1, wherein the engagement groove is a circular groove along a circumferential direction of the supporting member.

6. The connecting assembly according to claim 1, wherein the supporting member is used to control a distance between the first connecting member and the second connecting member along an axial direction of the supporting member.

7. The connecting assembly according to claim 1, wherein the second connecting member is a casing.

8. The connecting assembly according to claim 1, wherein the first connecting member is a circuit board or copper bar.

9. The connecting assembly according to claim 1, wherein the first end of each of the supporting members is fixed to the first connecting member by welding.

10. The connecting assembly according to claim 1, wherein the first end of each of the supporting members is fixed to the first connecting member by a threaded connection.

11. A power supply unit, comprising the connecting assembly according to claim 1.

12. A power supply unit, comprising the connecting assembly according to claim 2.

13. A power supply unit, comprising the connecting assembly according to claim 3.

14. A power supply unit, comprising the connecting assembly according to claim 4.

15. A power supply unit, comprising the connecting assembly according to claim 5.

16. A power supply unit, comprising the connecting assembly according to claim 6.

17. A power supply unit, comprising the connecting assembly according to claim 7.

18. A power supply unit, comprising the connecting assembly according to claim 8.

19. A power supply unit, comprising the connecting assembly according to claim 9.

20. A power supply unit, comprising the connecting assembly according to claim 10.

* * * * *